United States Patent [19]

Pastoriza

[11] E Patent Number: Re. 31,850

[45] Reissued Date of Patent: Mar. 19, 1985

[54] SOLID STATE DIGITAL-TO-ANALOG CONVERTER

[75] Inventor: James J. Pastoriza, Lincoln, Mass.

[73] Assignee: Analog Devices, Incorporated, Norwood, Mass.

[21] Appl. No.: 298,528

[22] Filed: Sep. 1, 1981

Related U.S. Patent Documents

Reissue of:

[64] Patent No.: Re. 28,633
Issued: Nov. 25, 1975
Appl. No.: 102,854
Filed: Dec. 30, 1970

Which Is a Reissue of:

[64] Patent No.: 7,470,884
Issued: Jul. 17, 1973
Appl. No.: 524,474
Filed: Nov. 18, 1974

[51] Int. Cl.[3] ..... H03K 13/02

[52] U.S. Cl. ..... 340/347 DA; 307/303; 340/347 CC; 340/347 M

[58] Field of Search ..... 340/347 DA, 347 M; 307/297, 303

[56] References Cited

U.S. PATENT DOCUMENTS

| | | | |
|---|---|---|---|
| 3,019,426 | 1/1962 | Gilbert | 340/347 DA |
| 3,262,049 | 7/1966 | Watson et al. | 340/347 DA |
| 3,475,749 | 10/1969 | Plice | 340/347 DA |
| 3,569,960 | 3/1971 | Neiswinter et al. | 340/347 DA |
| 3,582,943 | 6/1971 | Weller | 340/347 DA |
| 3,588,530 | 6/1971 | Langan | 340/347 DA |
| 3,685,045 | 8/1972 | Pastoriza | 340/347 DA |

OTHER PUBLICATIONS

Rudin et al., System/Circuit Device Considerations, Feb. 15, 1967, International Solid-State Circuits Conference, pp. 16 & 17.

Rudin et al., A Family of Linear Integrated Circuits for Data Systems, 1967 Fall Joint Computer Conference, pp. 95-101.

Fairchild Semiconductor, UA722B 10 Bit Current Source, 1968, 4 pages.

Fairchild Semiconductor, Using the UA722 Precision Current Source, (No Date Listed), 18 pages.

Fairchild Semiconductor, Application of the UA722 10-Bit Current Source, 1968, pp. 1-26.

*Primary Examiner*—T. J. Sloyan

*Attorney, Agent, or Firm*—Parmelee, Bollinger & Bramblett

[57] ABSTRACT

A digital-to-analog converter comprising an IC switch module providing four switch transistors and associated switch-control buffering circuitry. The emitter areas of the switch transistors are binarily weighted to provide equal current densities. The IC substrate also is formed with a fifth transistor to serve as a reference transistor for adjusting the supply voltage as necessary to maintain constant current through the switch transistors. To construct a digital-to-analog converter having a high bit resolution, a number of such "quad" switch modules may be combined, for example in a printed circuit card assembly including a thin-film resistor module providing binarily-weighted resistors on a glass substrate to set the current levels through the switch transistors.

6 Claims, 8 Drawing Figures

114
116
132
134
136
124
126
128
130
106
108
110
122
102
120
120
+
-3v
150
148
146
144

110
116
52
10c
10B
146
10A
144
142
140

SOLID STATE DIGITAL-TO-ANALOG CONVERTER

Matter enclosed in heavy brackets [ ] appears in the original patent but forms no part of the first and this reissue specification; matter printed in italics indicates the additions made by the first reissue. Matter enclosed in double heavy brackets [[ ]] appears in the first reissue patent but forms no part of this reissue specification; matter printed in bold face indicates the additions made by this reissue.

This invention relates to digital-to-analog converters. More particularly, this invention relates to such converters based on solid-state electronics.

Digital-to-analog (D-A) converters have been required for a wide variety of purposes, such as transforming the digital outputs of a high-speed computer to corresponding analog voltages. D-A converters also are used in analog-to-digital converters. A wide variety of D-A converter designs have been proposed, and a number have been sold commercially. A particularly successful design is disclosed in co-pending application Ser. No. 809,700 filed by the present inventor on Mar. 24, 1969, now U.S. Pat. No. 3,685,045. Reference to that earlier application is hereby made for details of certain design features which are also incorporated in the embodiment of the present invention to be described below, and the priority date of that earlier application is herein asserted for such common subject matter.

With the development of integrated-circuit (IC) technology, efforts have been made to produce D-A converters in IC form, seeking the benefits of improved reliability, small size, low power consumption, and low production costs. However, prior IC converter designs have not suitably adapted IC technology to the special requirements of D-A converters, and have not satisfactorily exploited the real potential of such technology. It is therefore one goal of the present invention to provide D-A converter designs which achieve superior characteristics from a unique adaptation of integrated-circuit concepts and processing.

In a preferred embodiment of the invention to be described hereinbelow in detail, there is provided a D-A converter comprising a number of separate interconnected modules. The basic module of this converter is an IC switch unit having a single monolithic substrate in which has been diffused a number of switching transistors, together with associated control and logic circuitry for selectively activating the switches in accordance with a digital input signal. One or more such switch modules are [[assmelbed]] assembled on a printed circuit board together with a resistor module having a set of precision metering resistors which fix the level of current through the switching transistors in a binary weighting pattern.

The preferred switch module arrangement provides four switching transistors, and thus has been called a "quad-switch." D-A converters having resolutions of 4, 8, 12 or 16 bits can readily be provided, in a flexible manner, simply by using one, two, three or four identical "quad-switch" modules. Current-dividers of 16:1 attenuation ratio (or 10:1 for binary coded decimal) are used to reduce the current levels from the second, third or fourth switch modules to obtain the correct current contribution for each bit of the digital input.

The conductive areas of the switching transistors of each quad-switch module are binarily weighted in the proportional to the current carried by the associated transistor, so that the current density is the same for all switching transistors. This provides important benefits, including superior tracking and lower offset differences between switches. Each switch module substrate also is formed with an additional reference transistor which controls the supply voltage for all the switching transistors so as to effect nearly perfect compensation for the variables which can cause errors in the analog output signal.

Accordingly, it is an object of this invention to provide a superior D-A converter design based on IC technology. A further object of this invention is to provide a D-A converter having markedly improved performance characteristics. Still another object of this invention is to provide a D-A converter which can be manufactured economically, and which can flexibly be applied to meet diverse requirements. Other objects, aspects, and advantages of the invention will in part be pointed out in, and in part apparent from, the following description considered together with the accompanying drawings, in which:

FIG. 6 is a schematic diagram illustrating a modified form of compensation circuit;

Figure 1:
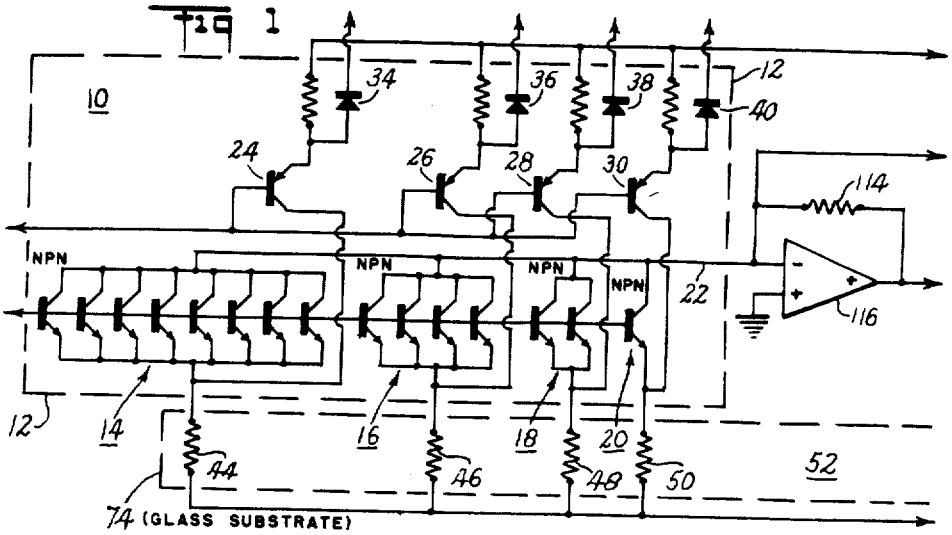
FIG. 1 shows schematically the circuit arrangement of a quad-switch module and its associated resistance network.

Referring now to FIG. 1, a [[quad-swtich]] quad-switch module 10 is schematically illustrated as a single monolithic substrate 12 having diffused therein four [[seprate]] separate switching transistors generally indicated at 14, 16, 18 and 20. Each transistor is represented symbolically as a number of parallel-connected sub-transistors, with the numbers of sub-transistors differing in accordance with a binary weighting pattern, i.e., in a ratio of 8:4:2:1.

The switching transistors are arranged as current sources, and the outputs of all of the transistors are connected together to a common line 22. The transistors are selectively activated by respective switch control and logic circuits comprising buffer transistors 24, 26, 28, 30 controlled through corresponding diodes 34, 36, 38, 40 in accordance with the respective bits of a digital input signal. A detailed description of such a switch control circuit is set forth in the abovementioned co-pending application Ser. No. 809,700.

The first transistor 14 provides a current output level representing the most-significant bit (MSB) of the digital input signal, the next transistor 16 provides half as much current representing the second-most-significant-bit, and so forth. The current level in each case is determined by a respective current-weighting metering resismodule 52. The ohmic resistances of these resistors may, for example, be 10K, 20K, 40K and 80K, respectively, to produce switch currents of 1 ma., 0.5 ma., 0.25 ma., and 0.125 ma.

Figure 2:
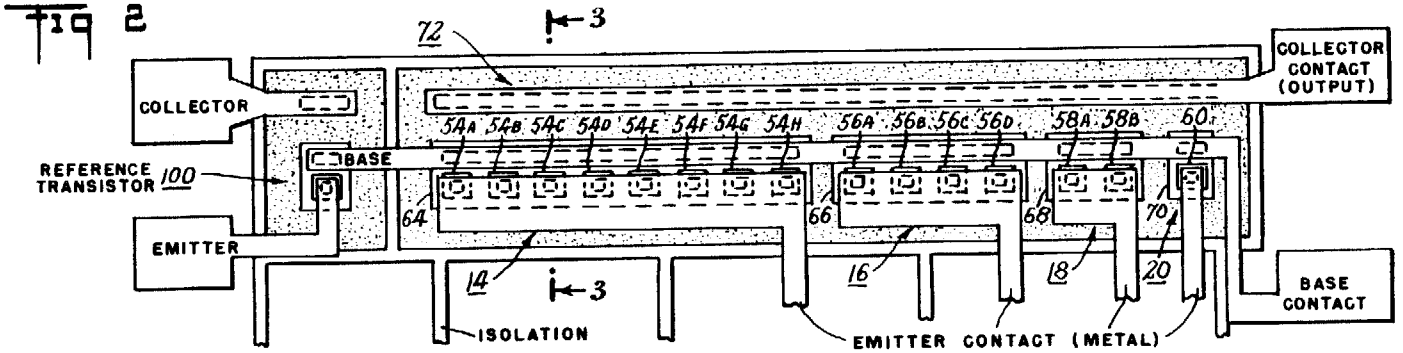
FIG. 2 is a schematic plan view of the portion of the IC chip (substrate) carrying the switching transistors of the quad-switch module of FIG. 1.
Figure 3:
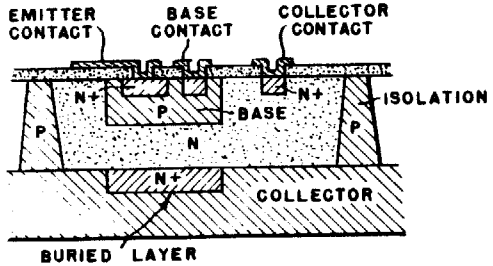
FIG. 3 is a cross-section taken along line 3—3 of FIG. 2, showing the layers defining the different transistor segments.

Referring also to FIGS. 2 and 3, all of the transistors 14–20 have collector, base, and emitter segments diffused in the substrate 12. The conductive areas of these transistors are binarily weighted to correspond with the current flowing through the transistor. Specifically, the total areas of the respective emitters 54, 56, 58, 60 are in direct proportion to the currents to be carried by the corresponding transistors.

In the preferred embodiment, the emitter areas are so proportioned by providing for each transistor a predetermined number of equal-area emitters 54A, 54B, . . . 56A, 56B, . . . etc., with the number of emitters for each transistor being in accordance with a binary weighting pattern. Thus, the right-hand transistor 20 includes a single emitter 60 of preselected area, the next transistor 18 includes two emitters 58A, 58B of that preselected area, and so forth. The size of the base segment 64, 66, 68, 70 of each transistor is roughly proportioned to the surrounding emitter area, and a single common collector segment 72 is provided for all transistors of the switch module.

By proportioning the emitter areas of the switching transistors 14–20 to the level of current to be carried, the current density is made uniform throughout the conducting regions of all transistors. This results in essentially equal base-to-emitter voltages ($V_{BE}$) for all of the switching transistors. Initial offset between switches, as well as offset drift between switches, are minimized by this arrangement, so as to provide improved accuracy. Because all transistors are diffused on a single common substrate, the transistor characteristics (particularly "Beta") will be effectively matched for all switches, further minimizing errors in the output due to changes in variables such as temperature.

The resistor module 52 is assembled together with the switch module 10 by interconnecting means, preferably a single printed circuit board. The resistor module comprises a non-conductive substrate 74 (glass or the like) on which is deposited by known techniques (e.g., sputtering) a thin film of a metallic substance such as nichrome, arranged to form a set of resistors having the required ohmic resistance. Resistors of this type have very low temperature coefficients, so that there will be only small changes in current with changes in temperature. By having all of the resistors on a single substrate, and formed of the same material, any changes in resistance will be proportionately the same for all resistors, thereby assuring uniform performance characteristics for the individual switches.

Figure 4:
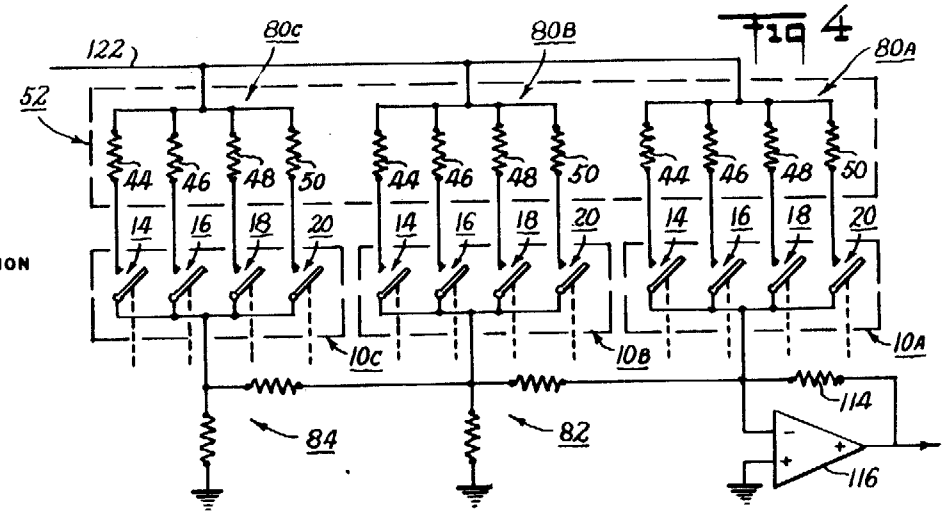
FIG. 4 shows schematically how three identical quad-switch modules are combined with a resistor module to form a 12-bit D-A converter.

FIG. 4 shows schematically a 12-bit D-A converter composed of three identical quad-switch modules 10A, 10B, 10C assembled with a binary resistor module 52 as described above. The resistor network includes three identical sets 80A, 80B, 80C of four current-weighting resisotrs 44, 46, 48, 50. The resistors of each set are connected to the respective transistors 14, 16, 18, 20 of a corresponding quad-switch module as described above. The resistor module also includes current-dividing networks 82, 84 which attenuate the currents from the second and third quad-switch modules by factors of 16:1 and 256:1.

One important advantage of the module construction described above is that the range of required resistance values is relatively low. For example, in the preferred quad-switch module, the resistance range required is only 8:1, a range well suited for commercial processing. In comparison, a conventional straight 12-bit converter would require a resistance range of 2048:1, e.g., a 10K resistor for the MSB and a 20 megohm resistor for the LSB.

It is difficult to make resistors of such widely different values as 10K and 20 megohm from the same resistance alloy. On the other hand, if different materials are used for the high and low value resistors, they will have different temperature coefficients, and hence will introduce tracking errors with changes in operating temperature. Tracking errors lead to degraded linearity and loss of monotonicity. Loss of linearity results in unequal incremental steps. Loss of monotonicity means that, at some points, the output current will decrease in response to an increased digital number.

These problems and difficulties are avoided or substantially minimized by the module construction described hereinabove, wherein the range of resistance values required for each switch module is relatively small, and the resistors are formed by thin film deposition on a single substrate. Moreover, the modular concept permits the current through the LSB transistor switch to be large relative to the transistor leakage. For example, in the preferred four-transistor "quad-switch" package, the smallest switch current is 0.125 ma., well above the transistor leakage level. In comparison, the LSB current in a straight 12-bit converter may be as low as 500 nanoamps, which begins to approach the transistor leakage value and hence may well be subject to switching error.

Another advantage of the modular concept described hereinabove is that it simplifies production testing. A quad-switch, for example, need be tested only for 16 different codes. Thus a total of only 48 code tests need be made for the three quads used to make up a 12-bit converter. In comparison, a conventional straight converter may require testing by 1,000 or so codes, leading to higher manufacturing cost.

The modular concept provides another benefit in manufacturing, because it divides the IC processing into smaller but identical units. In the IC process, the "yield" (i.e., the proportion of acceptable units) is generally proportional to the size of a unit, whereas the cost is generally proportional to the square of the size. By sub-dividing the complete device into a set of identical smaller units, the overall manufacturing operation is made more effective.

The module arrangement described herein lends itself well to standard commercial packaging configurations, such as the DIP pack (14 or 16 pin) or the so-called flat-pack. Thus the converter is well adapted for flexible application to many different types of electronic apparatus requirements.

The provision of exactly four switching transistors in each module is an especially advantageous feature. This number of switches affords an apparently optimum balance between the need to minimize the range of current-weighting resistance values and the need to reduce the number of separate components which must be assembled into a complete unit. It also represents a practical number of switches which can be provided with equal current densities in an IC configuration. Also of importance is the fact that quad-switches can readily be assembled to provide either a straight binary conversion, or a binary-coded-decimal (BCD) conversion, simply by selecting the appropriate current-dividing attenuation networks between the separate quad units.

Figure 5:
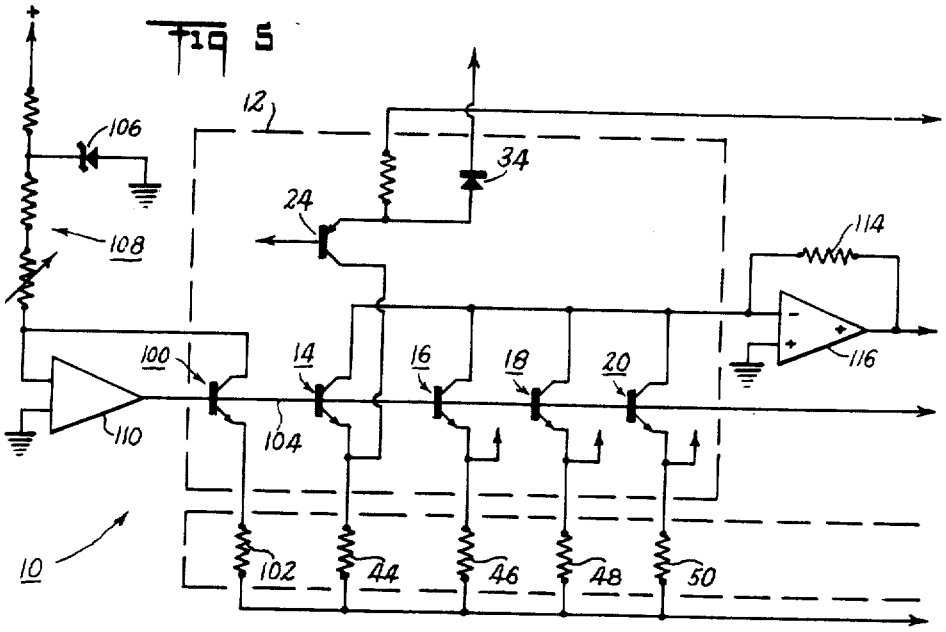
FIG. 5 is a schematic diagram showing a compensation circuit for stabilizing the converter output with changes in ambient temperature and/or other variables.

Further refinements in performance can be obtained by using a compensation circuit as shown in FIG. 5. In this arrangement, a quad-switch module 10, like that in FIG. 1, is provided with an additional transistor 100 diffused in the substrate 12 (see also FIG. 2). This additional transistor serves as a reference for controlling the base supply voltage for the four switching transistors.

The reference transistor 100 is identical to the LSB transistor 20, having a single emitter and a base like that of the LSB transistor. The resistor module 52 is provided with an additioanl 80K current-metering resistor 102 for the reference transistor. The base of the reference transistor is connected to the common base rail 104 for the switching transistors.

The current flowing into the reference transistor 100 is fixed at exactly 0.125 ma. by a regulated current source comprising a Zener diode 106, a current-setting reference resistor 108, and an operational amplifier 110 the output of which drives the base of the reference transistor (and thereby drives the bases of all of the switching transistors due to the common base rail 104). The reference resistor 108 is trimmed to the precise value to produce 0.125 ma. into the collector of the reference resistor. Since the LSB switching transistor is identical to the reference transistor (same size emitter and base), and both are connected to identical resistors 50, 102 of the resistor module 52, the current into the LSB transistor also must be 0.125 ma., and the current densities must be equal. And since the other switching transistors are, in effect, exact multiples (binarily weighted) of the LSB transistor, the currents through those other transistors similarly will be exact binary multiples of the LSB current.

In more detail, the reference current established by zener diode 106 and reference resistor 108 is summed with the collector current of the reference transistor 100. The operational amplifier 110 adjusts the voltage of the common base line 104 to make the two currents equal. With the reference current thus properly established, all other currents will be in the correct proportion to one another, since the base-to-emitter drops ($V_{BE}$) of all of the IC transistors will be equal.

Any changes in the parameters of the switching-transistor circuitry will be compensated for by the feedback action of the amplifier 110, which will tend to hold constant the current into the collector of reference transistor 100, and thereby (in open loop mode) hold constant the actual output currents of the switching transistors. Any change in a circuit parameter which tends to alter the collector currents of the switching transistors 14–20 will similarly tend to alter the reference transistor collector current from equality with the originally established reference current. Such a tendency of the reference transistor collector current to change will be sensed at the input to amplifier 110, and its output will alter the base voltage of the reference transistor (and the bases of all of the switching transistors) so as to maintain the original current levels.

It should be noted that the reference transistor collector current corresponds identically to the currents of the switching transistors which must be held constant. That is, the output of the D-A converter is, basically, the collector currents of the activated switching transistors. Thus, by holding constant the reference transistor collector current, and thereby holding constant the switching transistor collector currents, the output of the D-A converter will be held constant even in the face of changes in such parameters as base current, collector leakage current, or base-to-emitter-voltage.

The temperature performance of the unit is enhanced by the fact that the additional metering resistor 102 is part of the resistor module 52. Tracking between resistance values of such thin film resistors is ±1 part-per-million per °C., so that any temperature-induced change in resistance of the current-weighting resistors 44–50 will be accompanied by a corresponding change in the resistance of resistor 102. The resulting tendency of the current through reference transistor 100 to change will be sensed by the operational amplifier 110, and its output will change correspondingly to adjust the base voltages so as to hold the currents constant.

Advantageously, the resistor module 52 also contains the power supply reference resistor 108 and the feedback resistor 114 of an output operational amplifier 116. If there is a change in resistance of the reference resistor 108, there will be a corresponding change in the collector currents of all of the transistors of the quad-switch, but this will be compensated for by a change in the resistance of the feedback resistor 114, so as to maintain the final output substantially constant.

FIG. 6 shows another compensation arrangement for the quad-switch module 10. Here the common base line 120 for the switching transistors is tied to a fixed voltage (e.g., −3 volts), and the output of the reference amplifier 110 controls the voltage of the common line 122 to which all of the resistors are connected. In general, this compensation arrangement works on much the same basic principles as that of FIG. 5, in that the output of the reference amplifier is automatically controlled by sensing the differential between a reference current through resistor 108 and the collector current of the reference transistor 100. The amplifier in effect adjusts the voltage differential applied to the transistor base-to-emitter circuits so as to hold the collector currents constant.

The arrangement of FIG. 6 includes biasing circuitry used in a typical IC quad-switch module 10. This circuitry includes clamping diodes 124–130 to keep the buffer transistors 24–30 from saturating when those PNP devices are diverting the currents from the associated switching transistors. The circuit also incorporates transistors 132, 134, 136 for setting the base voltage of the buffer transistors.

Figure 8:
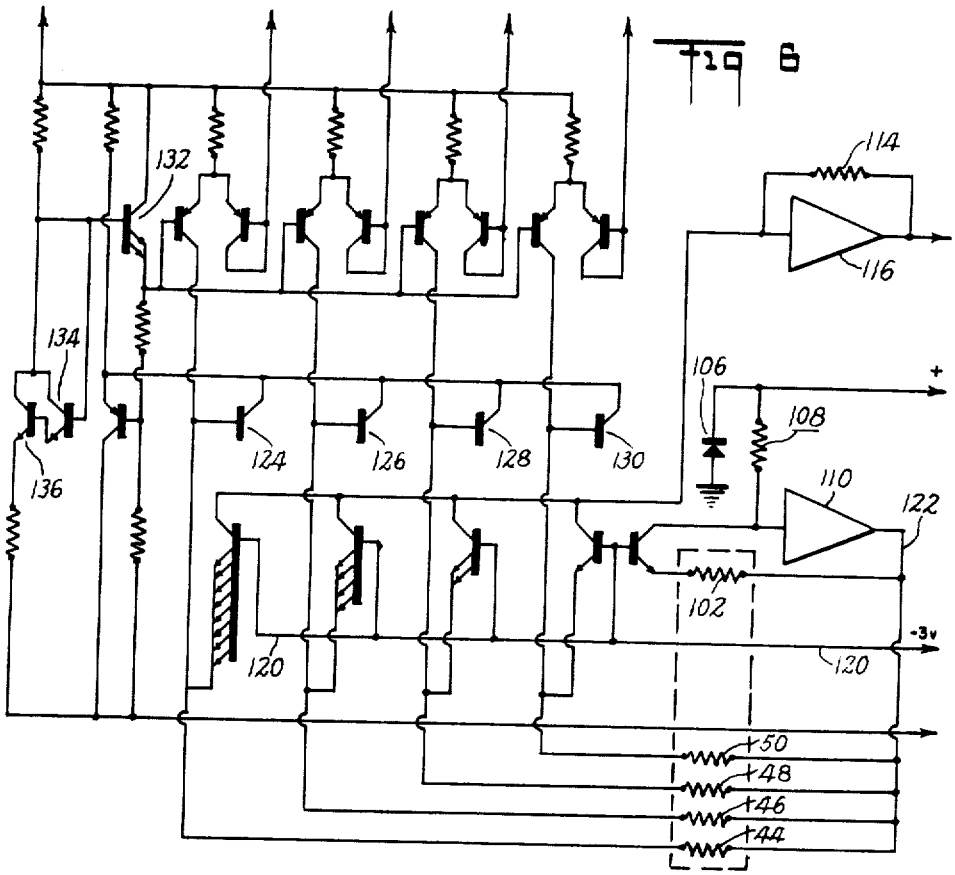
FIG. 8 shows the physical arrangement of the principal components making up the D-A converter illustrated in FIG. 7.
Figure 8:
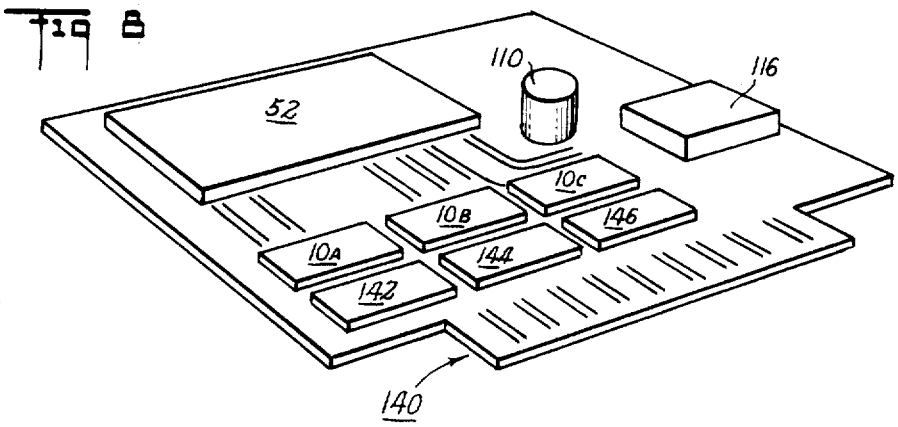
Figure 7:
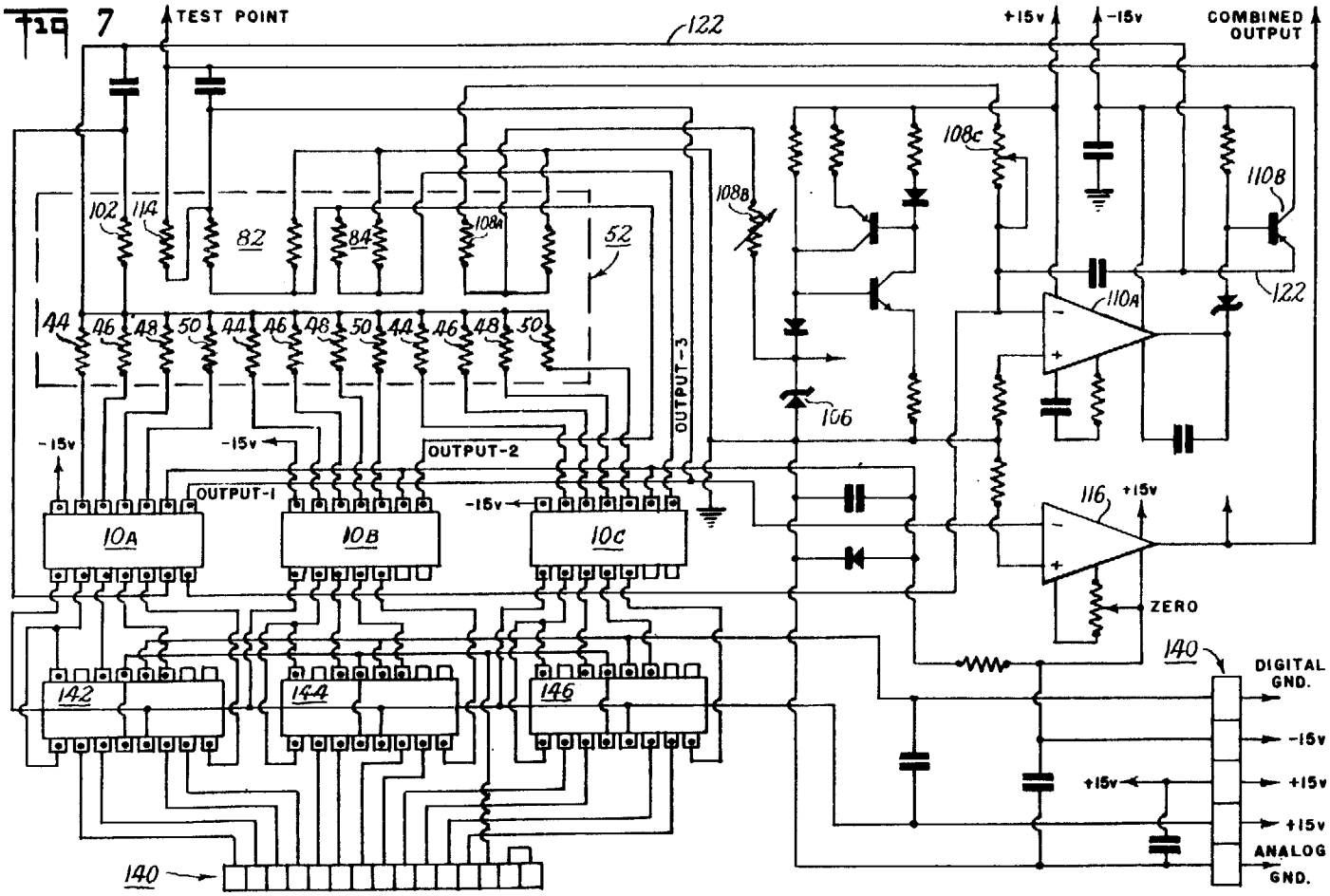
FIG. 7 is a wiring diagram of a 12-bit D-A converter.

FIG. 7 is a wiring diagram showing details of a complete D-A converter using three quad-switch modules 10A, 10B, 10C and a resistor module 52 interconnected by conductive elements of a printed circuit board. FIG. 8 illustrates the physical arrangement of the several components. Input connections to the converter are made through contacts 140 on one edge of the circuit board. The parallel digital input signal is directed through corresponding leads to three 4-bit registers 142, 144, 146 where the digital bits are strobed into respective storage stages for application to the input diodes of the switch control circuitry in each quad-switch.

The resistor module 52 contains all of the current-weighting resistors, the 16:1 current-dividing networks 82, 84, the power supply reference resistor 108, and the output feedback resistor 114. The reference amplifier 110 controls the common resistor line 122, as in the FIG. 6 arrangement discussed above. Although all quad-switch modules contain reference transistors 100, only one is neede for controlling the common resistor line. The reference transistor in the first module 10A is used for this purpose. The printed circuit board carries the reference amplifier 110 and the output operational amplifier 116, and performs the usual function of furnishing interconnections between the different components, as shown in the diagram.

Although preferred embodiments of the invention have been described hereinabove in detail, it is desired to emphasize that such details have been disclosed for the purpose of illustrating the nature of the invention, and should not be considered as necessarily limiting of the invention which can be expressed in many modified forms to meet particular requirements.

I claim:

1. An integrated-circuit digital-to-analog converter comprising:

a plurality of transistors on a single monolithic substrate;

switch control means operable by a digital input for selectively activating any of said transistors to pass current therethrough;

circuit means for said transistors to set different levels of current therethrough according to a predetermined weighting pattern such that the sum of the currents produced by the activated transistors represents an analog output in accordance with the required digital-to-analog relationship;

each of said transistors being formed to present in said substrate a respective conductive area proportional to the particular current level assigned thereto in accordance with said weighting pattern, to provide uniform current density in said transistors when activated; and means for summing the currents flowing through the transistors activated by said switch means so as to provide said analog output;

said substrate being formed with four switching transistors the emitters of which have areas in the ratios of 1:2:4:8.

[[2. A converter as in claim 1, wherein said transistors are provided with different numbers of emitters proportional to the magnitude of current to be passed, said emitters all having equal areas.]]

[[3. A converter as in claim 1, including a second substrate having a plurality of resistors formed thereon; and means interconnecting each of said transistors with a respective one of said resistors to control the current through each transistor in accordance with the ohmic resistance of the associated resistor.]]

[[4. A converter as in claim 1, wherein said substrate is formed with four switching transistors the emitters of which have areas in the ratios of 1:2:4:8.]]

[[5. Apparatus as in claim 1, wherein said substrate has said plurality of transistors diffused therein to serve as separate current sources corresponding to respective bits of a digital input signal;

each of said transistors comprising an emitter, a base and a collector;

the areas of the respective emitters for said transistors differing in accordance with a binary weighting pattern.]]

[[6. Apparatus as in claim 5, wherein each of said transistors has a number of separate equal-size emitter sections, with the number of sections in each case being in accordance with said binary weighting pattern.]]

[[7. Apparatus as in claim 5, wherein the size of the base segment for each transistor is at least approximately proportional to the area of the corresponding emitter.]]

[[8. Apparatus as in claim 7, wherein said substrate is formed with a single collector segment common to all of said transistors.]]

[[*9. An integrated-circuit digital-to-analog converter comprising:*

*a plurality of transistors on a single monolithic substrate;*

*an output line;*

*switch control means operable by a digital input for selectively activating any of said transistors to pass the current thereof through said output line;*

*circuit means for said transistors to set different levels of current through each transistor according to a predetermined weighting pattern such that the sum of the currents produced in said output line by the selected transistors represents an analog output corresponding to said digital input;*

*each of said transistors being formed to present in said substrate a respective conductive area proportional to the particular current level assigned thereto in accordance with said weighting pattern to provide uniform current density in the activated transistors.*]]

[[*10. Apparatus as in claim 9, wherein the emitter area of each of said transistors is proportional to the particular current level assigned thereto.*]]

*11. An integrated-circuit digital-to-analog converter comprising:*

*a* first *plurality of transistors on a single monolithic substrate each adapted to conduct current;*

*an output line;* first *means operable by a* first part of a *digital input signal for developing in said output line a flow of current representing the summation of the currents of any of said* first *transistors selected in accordance with* said first part of *said digital input signal;*

*circuit means for said* first *transistors to set different levels of current therethrough according to a predetermined weighting pattern such that the sum of the currents produced in said output line by the transistors represents* [[*an*]] a first *analog output signal corresponding to said* first part of said *digital input signal;*

*each of said* first *transistors being formed to present in said substrate a respective conductive area proportional to the particular current level assigned thereto in accordance with said weighting pattern to provide uniform current density in said transistors.* ;

a second plurality of transistors on a substrate each adapted to conduct current;

said second plurality of transistors being matched to said first plurality of transistors;

second means operable by a second part of said digital input signal for developing in said output line a flow of current representing the summation of the currents of any of said second plurality of transistors selected in accordance with said second part of said digital input signal;

said second means including means to attenuate the current contribution from said second transistor as developed in said output line to provide for proper relative weighting between that current contribution and the contribution of said first transistors;

circuit means for said second transistors to set different levels of current therethrough according to said predetermined weighting pattern, the sum of the currents produced in said output line by said second transistors, after attenuation by said attenuation means, representing an additive supplement to the analog output signal in accordance with said second part of said digital input signal, properly weighted relative to said contribution of said first transistors;

each of said second transistors being formed to present a respective conductive area proportional to the particular current level assigned thereto in accordance with said predetermined weighting pattern to provide a current density in said second transistors which is uniform and equal to the current density of said first transistors.

12. A converter as in claim 11, wherein all of said transistors include base, emitter and collector electrodes;

the area of each of said transistor emitters being proportional to the magnitude of current therethrough.

13. A converter as in claim 12, wherein said second transistors are formed on a second substrate different from the substrate carrying said first transistors.

14. A converter as in claim 12, wherein said first transistors are four in number and carry respective currents in the ratio of 8:4:2:1;

said second transistors being four in number and arranged to carry respective currents in the ratio of 8:4:2:1.

15. A converter as in claim 1, including a second plurality of integrated-circuit transistors at least substantially identical to said first plurality of transistors and operable to produce a second summation current corresponding to a second, lower-order part of said digital input; and attenuation means coupling said second summation current to said summing means to augment the summation current from said first plurality of transistors by the current from said second plurality of transistors attenuated by a factor corresponding to the relationship between said lower-order digital signal part and the order of the digital signal controlling said first plurality of transistors.

* * * * *

UNITED STATES PATENT AND TRADEMARK OFFICE

CERTIFICATE OF CORRECTION

PATENT NO. : RE. 31,850

DATED : March 19, 1985

INVENTOR(S) : James J. Pastoriza

It is certified that error appears in the above—identified patent and that said Letters Patent is hereby corrected as shown below:

On the title page;

In the Related U.S. Patent Documents

After "Which is a Reissue of:

Patent No.:" Change "7,470,844" to

--3,747,088--

Signed and Sealed this

Tenth Day of September 1985

[SEAL]

*Attest:*

DONALD J. QUIGG

*Attesting Officer* *Acting Commissioner of Patents and Trademarks - Designate*